(12) United States Patent
Stacey et al.

(10) Patent No.: US 6,911,093 B2
(45) Date of Patent: Jun. 28, 2005

(54) LID LINER FOR CHEMICAL VAPOR DEPOSITION CHAMBER

(75) Inventors: David Stacey, Portland, OR (US); Zach Prather, Gresham, OR (US); Jonathan Allinger, Sandy, OR (US)

(73) Assignee: LSI Logic Corporation, Milpitas, CA (US)

( * ) Notice: Subject to any disclaimer, the term of this patent is extended or adjusted under 35 U.S.C. 154(b) by 176 days.

(21) Appl. No.: 10/453,821

(22) Filed: Jun. 2, 2003

(65) Prior Publication Data

US 2004/0237891 A1 Dec. 2, 2004

(51) Int. Cl.⁷ .................... C23C 16/00; C23C 16/453; B23P 11/00
(52) U.S. Cl. .................. 118/715; 118/733; 29/801; 29/234; 29/243.5; 156/345.24
(58) Field of Search ................ 118/715, 733; 156/345.34; 29/801, 234, 243.5, 243.517

(56) References Cited

U.S. PATENT DOCUMENTS

| | | | | |
|---|---|---|---|---|
| 5,558,717 A | * | 9/1996 | Zhao et al. ............. | 118/715 |
| 5,846,332 A | * | 12/1998 | Zhao et al. ............. | 118/728 |
| 5,968,379 A | * | 10/1999 | Zhao et al. ............. | 219/121.52 |
| 5,983,906 A | * | 11/1999 | Zhao et al. ............. | 134/1.1 |
| 5,994,678 A | * | 11/1999 | Zhao et al. ............. | 219/530 |
| 6,035,101 A | * | 3/2000 | Sajoto et al. ........... | 392/416 |
| 6,050,506 A | * | 4/2000 | Guo et al. .............. | 239/558 |
| 6,063,441 A | * | 5/2000 | Koai et al. ............. | 427/248.1 |
| 6,079,356 A | * | 6/2000 | Umotoy et al. .......... | 118/723 E |
| 6,189,482 B1 | * | 2/2001 | Zhao et al. ............. | 118/723 R |
| 6,270,859 B2 | * | 8/2001 | Zhao et al. ............. | 427/535 |
| 6,364,949 B1 | * | 4/2002 | Or et al. ............... | 118/69 |
| 6,432,479 B2 | * | 8/2002 | Chang et al. ........... | 427/255.394 |
| 6,491,978 B1 | * | 12/2002 | Kalyanam .............. | 427/255.394 |
| 6,827,815 B2 | * | 12/2004 | Hytros et al. .......... | 156/345.33 |
| 2003/0051665 A1 | * | 3/2003 | Zhao et al. ............. | 118/723 E |
| 2004/0237891 A1 | * | 12/2004 | Stacey et al. ........... | 118/715 |

* cited by examiner

*Primary Examiner*—Jeffrie R. Lund
(74) *Attorney, Agent, or Firm*—Fitch, Even, Tabin & Flannery

(57) ABSTRACT

A lid liner for a chemical vapor deposition chamber includes an annular portion having an inner surface for surrounding a reaction volume within the chemical deposition chamber; a mounting tab formed on an outer surface of the annular portion; and a hole formed in the mounting tab for receiving a fastener wherein the hole does not penetrate the inner surface of the annular portion.

17 Claims, 5 Drawing Sheets

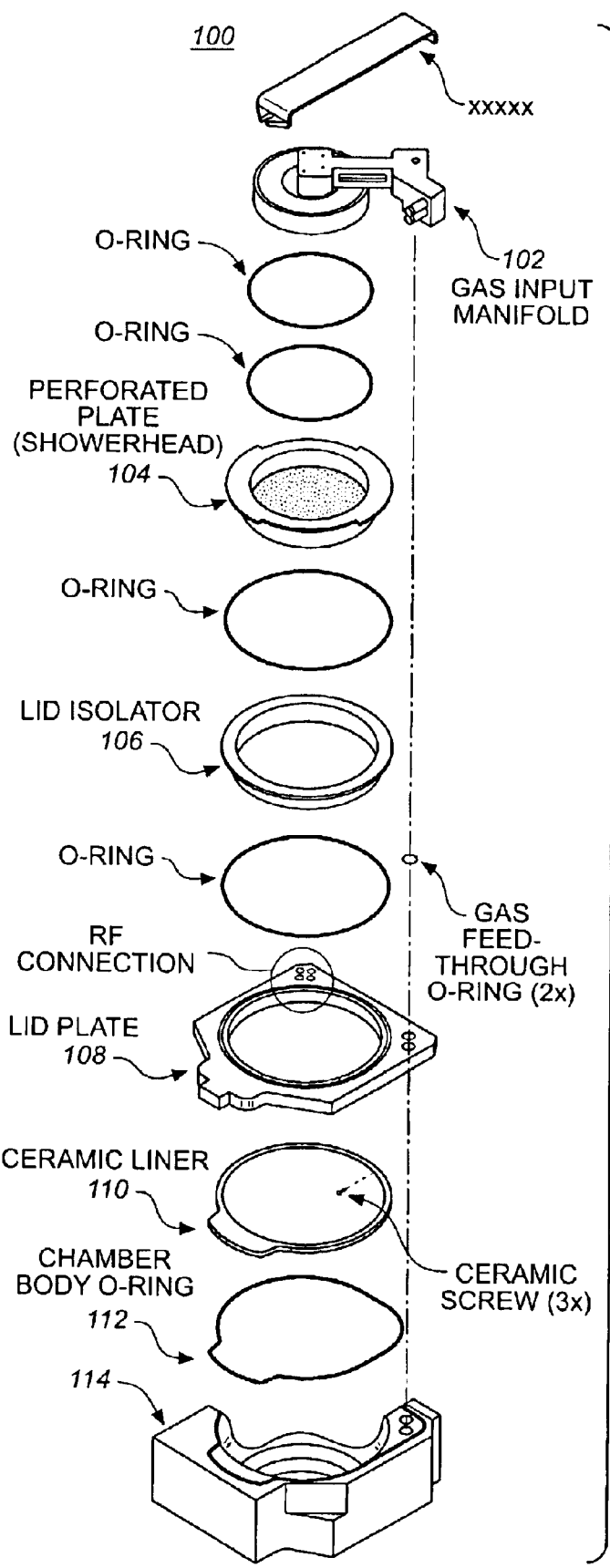
FIG._1
(PRIOR ART)
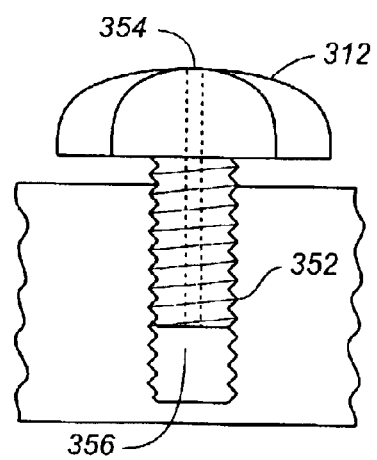
FIG._3C
(PRIOR ART)

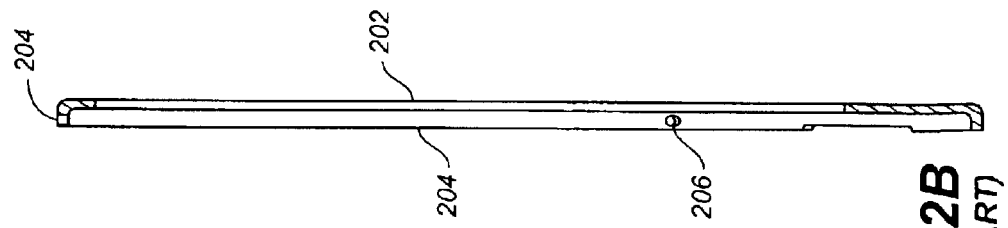
FIG._2B
(PRIOR ART)
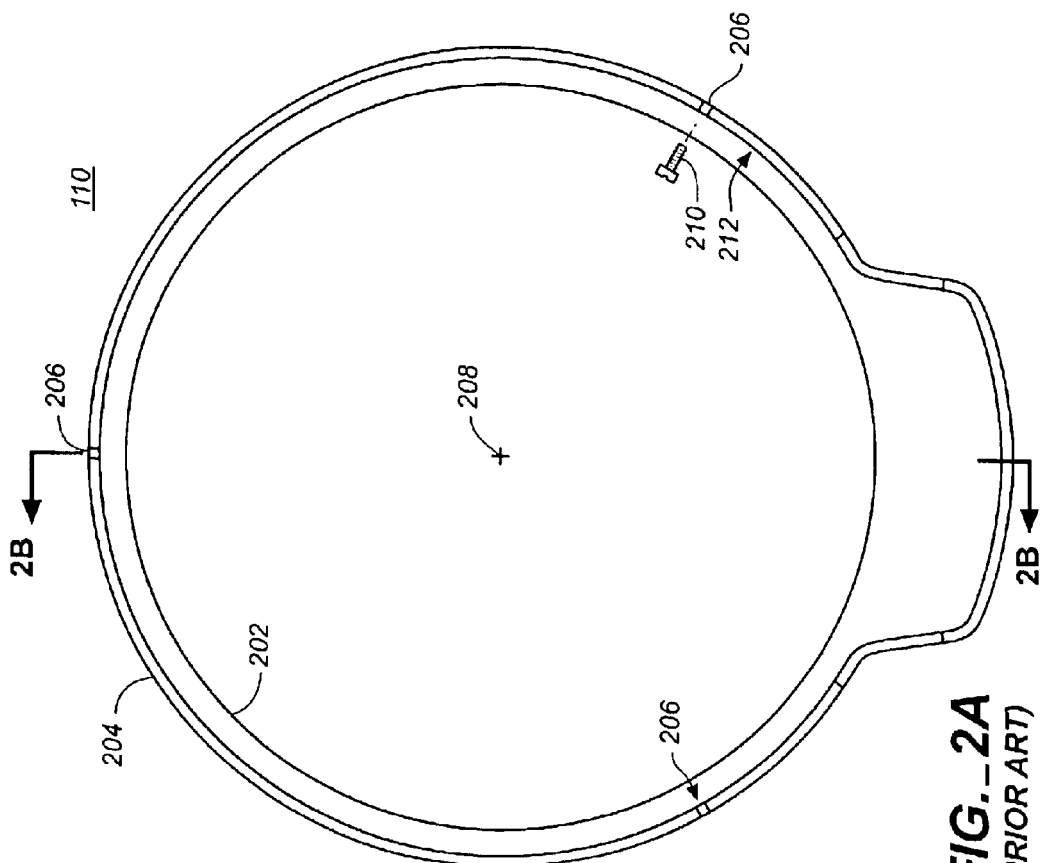
FIG._2A
(PRIOR ART)

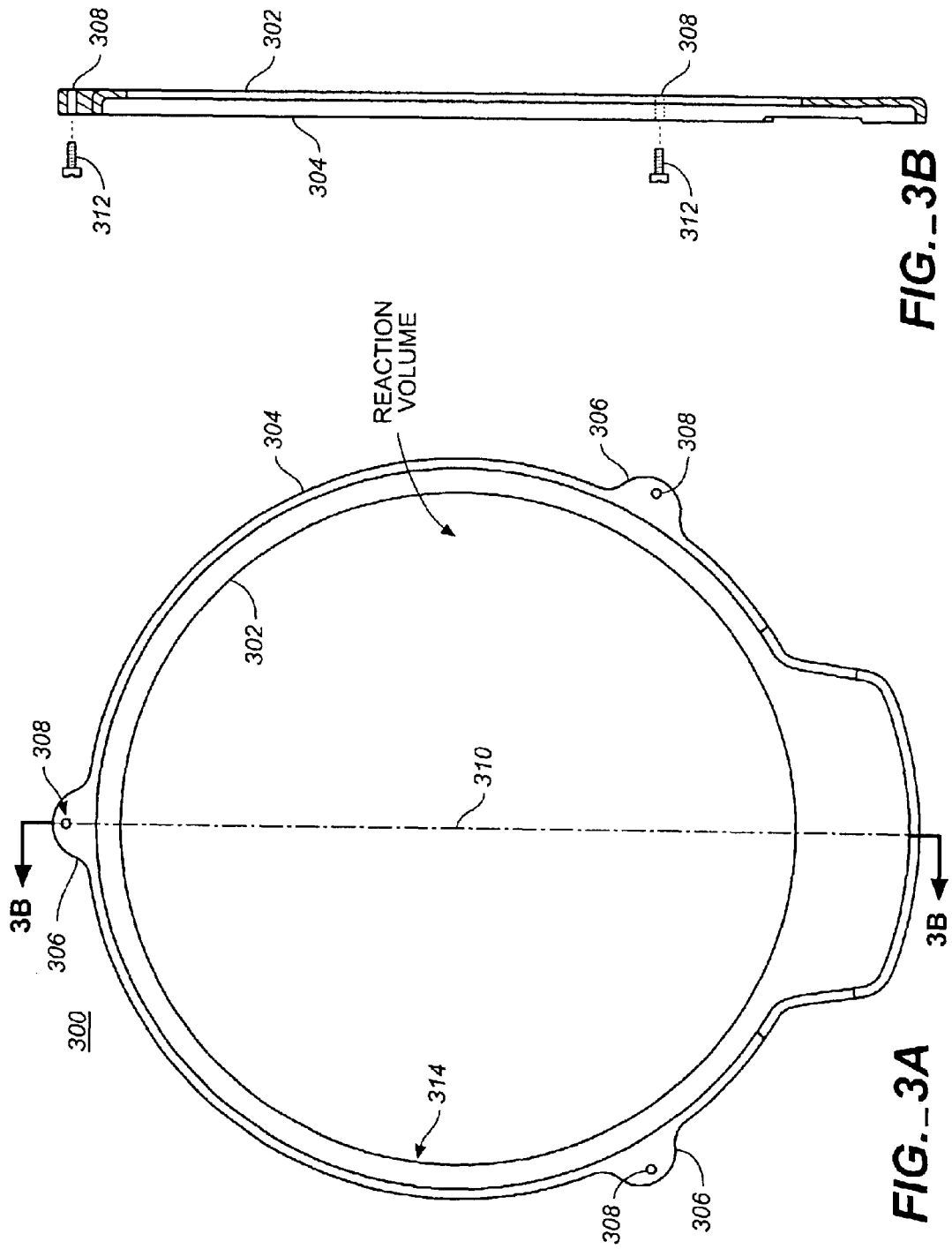

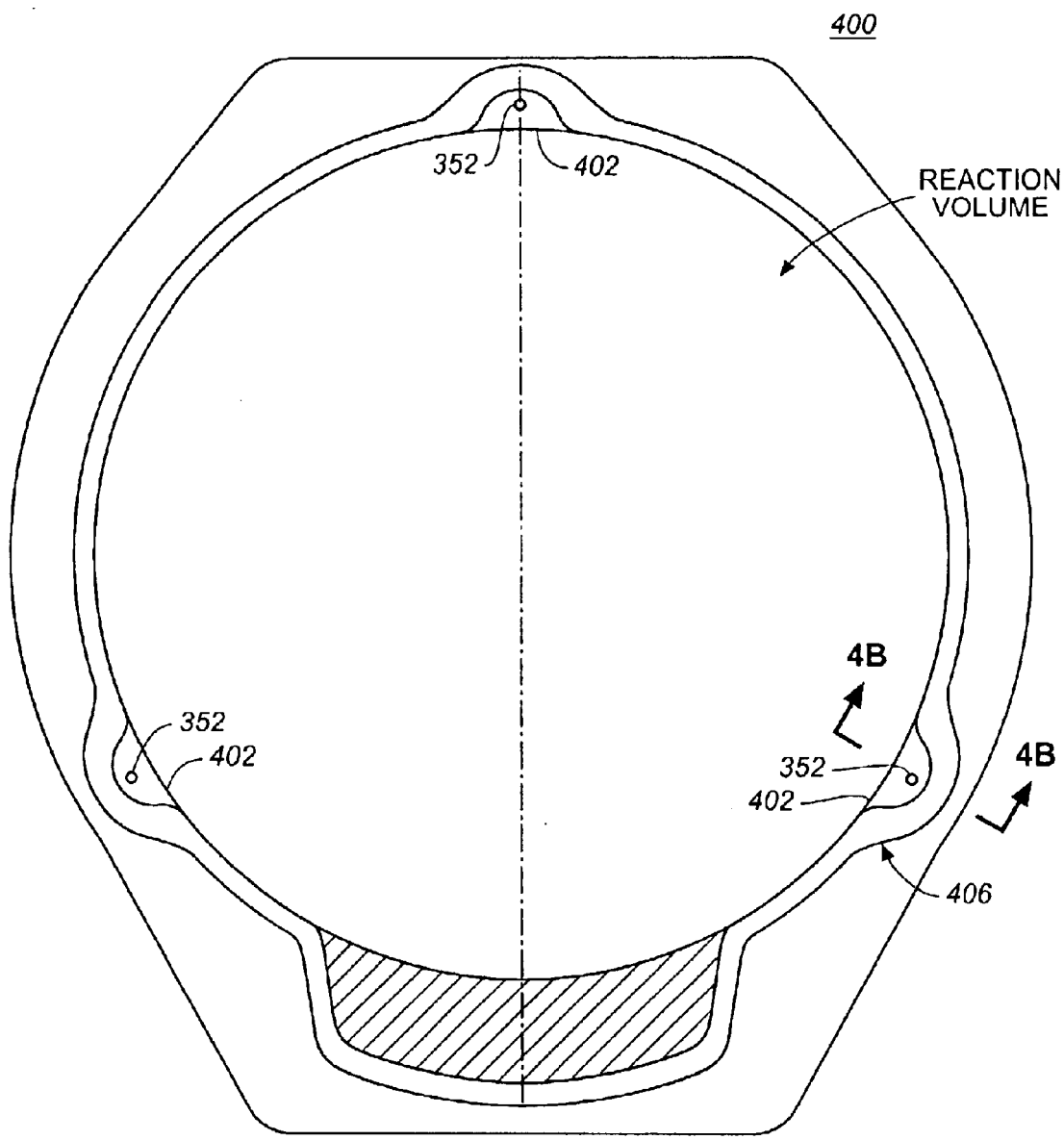
*FIG._4A*
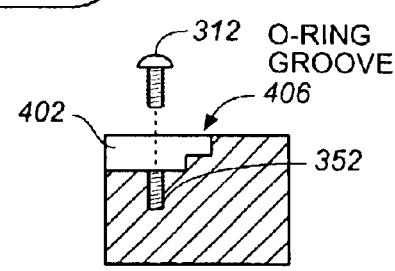
*FIG._4B*

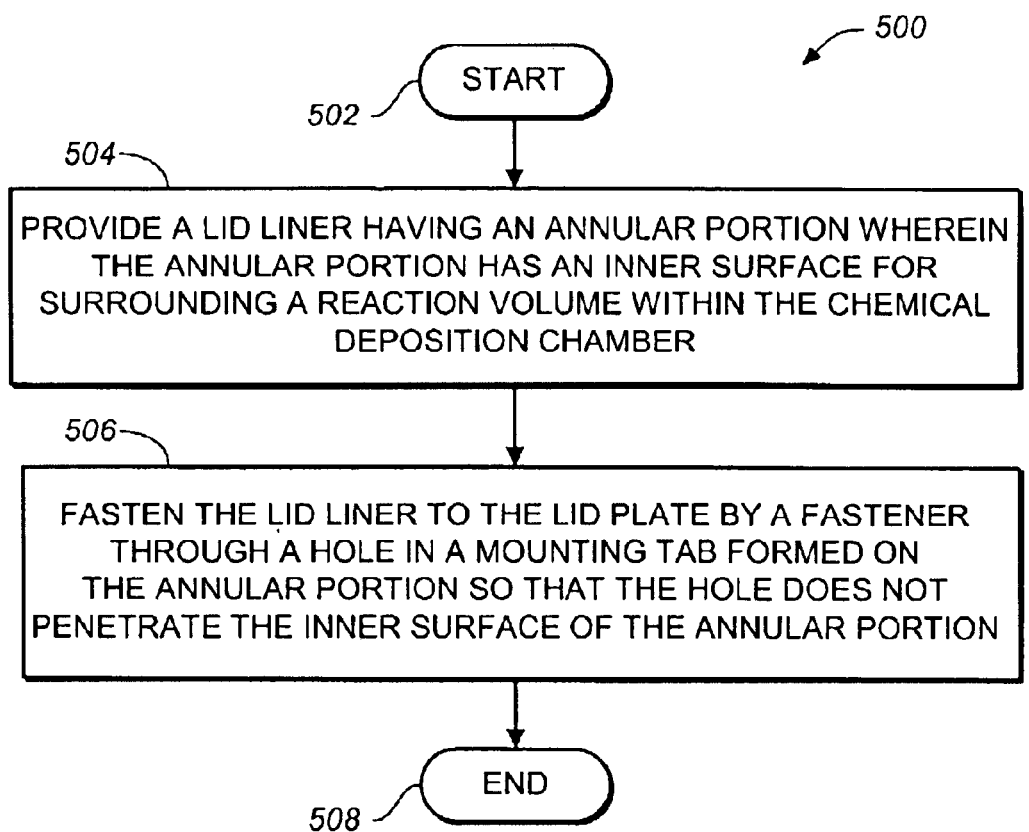
FIG._5

US 6,911,093 B2

LID LINER FOR CHEMICAL VAPOR DEPOSITION CHAMBER

BACKGROUND OF THE INVENTION

1. Field of the Invention

The present invention is directed to chemical vapor deposition (CVD) chambers such as those used in the manufacture of integrated circuits. More specifically, but without limitation thereto, the present invention is directed to an improved lid liner for a chemical vapor deposition chamber.

2. Description of the Prior Art

In a chemical vapor deposition (CVD) chamber of the prior art used in the manufacture of integrated circuits, available, for example, from Applied Materials (AMAT), gases containing a metallic or dielectric plasma are sprayed on a heated silicon wafer inside a reaction volume of the chemical vapor deposition chamber. The plasma reacts with the wafer surface, forming a thin film of solid material, for example, titanium nitride (TiN). Energy sources such as heat and radio frequency (RF) power may be used alone or in combination with the chemical vapor deposition chamber to achieve the plasma reaction on the wafer surface. The thin films range in thickness from a small fraction of a micron to a few microns and must be deposited with extreme uniformity across the wafer to meet manufacturing specifications.

Because the gases used in chemical vapor deposition chambers are highly reactive, the materials used inside the chemical vapor deposition chamber are generally made of chemically inert materials to avoid introducing contaminants into the reaction volume and to avoid corrosion of the interior surfaces of the chemical vapor deposition chamber.

SUMMARY OF THE INVENTION

In one aspect of the present invention, a lid liner for a chemical vapor deposition chamber includes an annular portion having an inner surface for surrounding a reaction volume within the chemical deposition chamber; a mounting tab formed on an outer surface of the annular portion; and a hole formed in the mounting tab for receiving a fastener wherein the hole does not penetrate the inner surface of the annular portion.

In another aspect of the present invention, a method of coupling a lid liner of a chemical deposition chamber to a lid plate includes steps of providing a lid liner having an annular portion wherein the annular portion has an inner surface for surrounding a volume within the chemical deposition chamber; and fastening the lid liner to the lid plate by a fastener through a hole in a mounting tab formed on the annular portion wherein the hole does not penetrate the inner surface of the annular portion.

BRIEF DESCRIPTION OF THE DRAWINGS

The present invention is illustrated by way of example and not limitation in the accompanying figures, in which like references indicate similar elements throughout the several views of the drawings, and in which:

FIG. 1 illustrates a simplified exploded view of some basic components of a typical chemical vapor deposition chamber 100 of the prior art;

FIGS. 2A and 2B illustrates top and side views respectively of the lid liner of FIG. 1;

FIGS. 3A and 3B illustrate top and side views respectively of a lid liner for the chemical deposition chamber of FIG. 1 according to an embodiment of the present invention;

FIG. 3C illustrates a vented screw of the prior art that may be used for the lid liner of FIGS. 3A and 3B;

FIGS. 4A and 4B illustrates a top view and a portion of a side view of a lid plate modified to accommodate the lid liner of FIGS. 3A and 3B; and FIG. 5 illustrates a flow chart for a method of coupling a lid liner of a chemical deposition chamber to a lid plate according to an embodiment of the present invention.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

FIG. 1 illustrates a simplified exploded view of some basic components of a typical chemical vapor deposition chamber 100 of the prior art. Shown in FIG. 1 are a gas input manifold 102, a perforated plate 104, a lid isolator 106, a lid plate 108, a ceramic lid liner 110, a chamber body O-ring 112, and a chamber body 114.

The ceramic lid liner 110 fits inside a recess formed in the lid plate 108 to couple the lid plate 108 to the chamber body 114. The chamber body O-ring 112 prevents contamination or leakage of the gases inside the chemical deposition chamber 100 from or to the outside environment.

The routine maintenance performed periodically on the chemical vapor deposition chamber 100 includes installation of a set of parts called a process kit. The process kit generally includes a replacement for the ceramic lid liner 110.

FIGS. 2A and 2B illustrate top and side views respectively of the ceramic lid liner 110 of FIG. 1. Shown in FIGS. 2A and 2B are an annular portion 202, a lip 204, mounting holes 206, a center 208, a ceramic screw 210, and an inner surface 212.

The annular portion 202 of the lid liner 110 surrounds a reaction volume inside the chemical deposition chamber 100 in which a wafer is exposed to a plasma. The lip 204 is formed around the outside edge of the annular portion 202 and extends perpendicularly from the annular portion 202. The mounting holes 206 are formed so that they extend radially from the center 208 of the annular portion 202 through the inner surface 212 of the lip 204.

The ceramic screw 210 is used to fasten the ceramic lid liner 110 to the lid plate 108. The ceramic screw 210 fits through one of the mounting holes 206 formed around the lip 204 of the ceramic lid liner 110 into threaded holes in the lid plate (not shown). Because the head of the ceramic screw 210 is exposed to the plasma flowing through the chamber body 112, the ceramic screw 210 is generally made of a non-reactive ceramic material.

Disadvantageously, the ceramic screw 210 frequently breaks while attempting to remove the lid liner 110 for maintenance. Replacements for the ceramic screw 210 are expensive, typically about $375 each or $1200 for a set of three. Also, an additional two to three hours of processing down time may be required to remove fragments of the broken ceramic screw 210 from the threaded holes (not shown) in the lid plate 108 and to repair damaged threads in the lid plate 108. Alternatively, the lid plate 108 may be replaced at an additional cost of about $8300. Because of the added expense and down time required to install the process kit, the lid liner 110 of FIG. 2 fails to meet minimum standards of maintainability.

The present invention advantageously avoids the problems associated with installing the process kit by locating the lid liner screws outside the reaction volume of the chemical vapor deposition chamber 100. Because the lid liner screws are not exposed to the plasma in the reaction volume, the lid liner screws may be made of inexpensive metals such as stainless steel that are far less susceptible to mechanical damage than are the ceramic screws 202.

In one aspect of the present invention, a lid liner for a chemical vapor deposition chamber includes an annular portion having an inner surface for surrounding a reaction volume within the chemical deposition chamber; a mounting tab formed on an outer surface of the annular portion; and a hole formed in the mounting tab for receiving a fastener wherein the hole does not penetrate the inner surface of the annular portion.

FIGS. 3A and 3B illustrate top and side views respectively of a lid liner 300 for the chemical deposition chamber 100 of FIG. 1 according to an embodiment of the present invention. Shown in FIGS. 3A and 3B are an annular portion 302, a lip 304, mounting tabs 306, mounting holes 308, a center 310, fasteners 312, and an inner surface 314.

In FIGS. 3A and 3B, the lid liner 300 may be made according to identical well-known techniques used to make the lid liner 110 of the prior art in FIG. 1. However, the lid liner 300 differs from the lid liner 110 of the prior art in that the lid liner 300 includes the mounting tabs 306. The mounting tabs 306 extend outward from the annular portion 302 radially with respect to the center 310. Preferably, the thickness of the mounting tabs 306 is identical to the thickness of the lip 304 plus the thickness of the annular portion 302. However, the thickness of the mounting tabs 306, the total number of the mounting tabs 306 formed on the annular portion 302, and the relative position of the mounting tabs 306 may be varied to practice various embodiments of the present invention within the scope of the appended claims. Each of the mounting tabs 306 includes a mounting hole 308 for fastening the lid liner 300 to the chamber body 112 outside the reaction volume of the chemical vapor deposition chamber 100 of FIG. 1.

An important feature of the present invention is that the mounting holes 308 are formed through the mounting tabs 306 so that the mounting holes 308 do not penetrate the inner surface 314 of the annular portion 302. This feature ensures that the heads of the fasteners 312 are not exposed to the plasma inside the reaction volume of the chamber body 112 surrounded by the annular portion 302 of the lid liner 300. In this example, three mounting tabs 306 are formed in the lid liner 300, however, other arrangements of one or more mounting tabs 306 may also be used to practice the present invention within the scope of the appended claims.

Because the mounting holes 306 do not penetrate the inner surface 314 of the annular portion 302, the heads of the fasteners 312 are outside the corrosive reaction volume of the chemical deposition chamber 100. Because the fasteners 312 are outside the reaction volume of the chemical deposition chamber 100, the fasteners 312 used to fasten the lid liner 300 to the lid plate 108 may be standard metal fasteners. For example, the fasteners 312 may be vented stainless steel screws as shown in FIG. 3C.

FIG. 3C illustrates a vented screw of the prior art that may be used for the lid liner 300 of FIGS. 3A and 3B. Shown in FIG. 3C are a vented screw 312, a threaded hole 352, a vent 354, and a well 356. The well 356 is a threaded hole formed according to well-known techniques in the lid plate 400 in FIG. 4 to receive the vented screw 350. As the vented screw 350 is fastened into the threaded hole 352, the vent 354 conducts gas from inside the well 356 to be pumped out of the reaction volume of the chemical deposition chamber 100. The vented screw 312 may be made of, for example, stainless steel. Stainless steel screws are far less expensive and far less susceptible to mechanical damage than ceramic screws. Accordingly, the loss of processing time and high costs required to maintain the chemical deposition chamber 100 associated with ceramic screws are advantageously avoided.

FIGS. 4A and 4B illustrate a top view and a portion of a side view of a lid plate 400 modified to accommodate the lid liner 300 of FIGS. 3A and 3B. Shown in FIG. 4 are a lid liner recess 402, threaded holes 352, and an O-ring recess 406.

In FIG. 4, the lid liner recess 402 is shaped to receive the lid liner 300 in the same manner as in FIG. 1, except that the lid liner recess 402 is shaped to accommodate the mounting tabs 306 of the lid liner 300, and the threaded holes 352 are formed in the lid plate 400 to receive the fasteners 312 through the mounting tabs 306 of the lid liner 300. When the lid plate 400 and the lid liner 300 are fastened to the chamber body 114, the chamber body 114 covers the heads of the fasteners 312, thereby protecting the fasteners 312 from the plasma inside the reaction volume of the chemical vapor deposition chamber 100.

The O-ring recess 406 formed as shown in the lid plate 400 preferably has a shape that follows the contour of the mounting tabs 306 around the lid liner 300.

In another aspect of the present invention, a method of coupling a lid liner of a chemical deposition chamber to a lid plate includes steps of providing a lid liner having an annular portion wherein the annular portion has an inner surface for surrounding a reaction volume within the chemical deposition chamber; and fastening the lid liner to the lid plate by a fastener through a hole in a mounting tab formed on the annular portion wherein the hole does not penetrate the inner surface of the annular portion.

FIG. 5 illustrates a flow chart 500 for a method of coupling a lid liner of a chemical deposition chamber to a lid plate according to an embodiment of the present invention.

Step 502 is the entry point of the flow chart 500.

In step 504, a lid liner is provided having an annular portion wherein the annular portion has an inner surface for surrounding a reaction volume within the chemical deposition chamber as described above with respect to FIGS. 3A and 3B.

In step 506, the lid liner is fastened to the lid plate by a fastener through a hole in a mounting tab formed on the annular portion so that the hole does not penetrate the inner surface of the annular portion, for example, as shown in FIG. 3A.

Step 508 is the exit point of the flow chart 500.

While the invention herein disclosed has been described by means of specific embodiments and applications thereof, numerous modifications and variations could be made thereto by those skilled in the art without departing from the scope of the invention set forth in the following claims.

What is claimed is:

1. A lid liner for a chemical vapor deposition chamber comprising:

an annular portion having an inner surface for surrounding a reaction volume within the chemical deposition chamber;

a mounting tab formed on an outer surface of the annular portion; and a hole formed in the mounting tab for receiving a fastener wherein the hole does not penetrate the inner surface of the annular portion.

2. The lid liner of claim 1 wherein the annular portion is made of a non-reactive material.

3. The lid liner of claim 2 wherein the non-reactive material is a ceramic material.

4. The lid liner of claim 1 further comprising the fastener for fastening the lid liner to the lid plate.

5. The lid liner of claim 4 wherein the fastener is made of a metal.

6. The lid liner of claim 5 wherein the metal is stainless steel.

7. The lid liner of claim 1 wherein the hole extends through the mounting tab substantially perpendicular to the mounting tab.

8. The lid liner of claim 1 wherein the mounting tab extends substantially parallel to the annular portion.

9. A method of coupling a lid plate to a chamber body of a chemical deposition chamber comprising steps of:

providing a lid liner having an annular portion wherein the annular portion has an inner surface for surrounding a reaction volume within the chemical deposition chamber; and fastening the lid liner to the lid plate by a fastener through a hole in a mounting tab formed on the annular portion wherein the hole does not penetrate the inner surface of the annular portion.

10. The method of claim 9 wherein the annular portion is made of a non-reactive material.

11. The method of claim 10 wherein the non-reactive material is a ceramic material.

12. The method of claim 9 wherein the hole extends through the mounting tab substantially perpendicular to the annular portion.

13. The method of claim 9 wherein the fastener is a vented screw.

14. The method of claim 9 wherein the fastener is made of a metal.

15. The method of claim 14 wherein the metal is stainless steel.

16. The method of claim 9 wherein the hole extends through the mounting tab substantially perpendicular to the annular portion.

17. The method of claim 9 wherein the mounting tab extends from the annular portion radially outward from a center of the annular portion and parallel to the annular portion.

* * * * *